(12) United States Patent
Yao et al.

(10) Patent No.: US 6,423,161 B1
(45) Date of Patent: Jul. 23, 2002

(54) HIGH PURITY ALUMINUM MATERIALS

(75) Inventors: Lijun Yao; Tadao Ueda, both of Niigata (JP)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/627,496

(22) Filed: Jul. 28, 2000

(30) Foreign Application Priority Data

Oct. 15, 1999 (JP) .......................................... 11-293573
Apr. 28, 2000 (JP) ....................................... 2000-129739

(51) Int. Cl.⁷ .............................................. C22C 21/00
(52) U.S. Cl. .................. 148/437; 420/528; 204/298.13; 204/298.14
(58) Field of Search ..................... 148/437; 420/528; 204/298.13, 298.14

(56) References Cited

U.S. PATENT DOCUMENTS

| 4,319,935 A | 3/1982 | Blaudelet et al. |
| 5,282,946 A | 2/1994 | Kinoshita et al. |
| 5,456,815 A * | 10/1995 | Fukuyo et al. ......... 204/298.13 |
| 5,590,389 A | 12/1996 | Dunlop et al. |
| 5,718,778 A | 2/1998 | Murata et al. |
| 5,780,755 A | 7/1998 | Dunlop et al. |
| 5,809,393 A | 9/1998 | Dunlop et al. |
| 5,955,673 A * | 9/1999 | Leroy et al. ........... 204/298.13 |
| 6,238,494 B1 | 5/2001 | Segal et al. |

FOREIGN PATENT DOCUMENTS

JP         11-050244 A      2/1999

OTHER PUBLICATIONS

U.S. application Ser. No. 09/408,005, Segal, filed Sep. 29, 1999.

* cited by examiner

*Primary Examiner*—Roy King
*Assistant Examiner*—Harry D Wilkins, III
(74) *Attorney, Agent, or Firm*—Wells St. John P.S.

(57) ABSTRACT

The invention includes a material containing aluminum grains which have an average grain size of less than 20 μm. The material contains manganese, with a total non-aluminum content of 0.01 to 10.0% by weight. The material is preferably used as a sputtering target. A sputtering target is produced by subjecting the material to plastic working at a processing percentage of at least 5% at a processing rate of at least 100%/second.

7 Claims, 2 Drawing Sheets

HIGH PURITY ALUMINUM MATERIALS

RELATED PATENT DATA

This application claims priority under 35 U.S.C. §119 to Japanese Patent Application No. 2000–129739, which was filed Apr. 28, 2000, and published as No. 2001–316803. This application also claims priority under 35 U.S.C. § 119 to Japanese Patent Application No. 11–293573, which was filed Oct. 15, 1999, and published as No. 2001–115257.

TECHNICAL FIELD

The present invention relates to a process for producing a material with reduced grain sizes, and can be used, for example, to produce sputtering target materials (i.e., physical vapor deposition target materials, and it is to be understood that in the context of this document the terms "physical vapor deposition" and "sputtering" can be used interchangeably). In particular applications, the sputtering target materials can comprise titanium, aluminum or copper. The sputtering target materials can hereinafter be referred to as a "target materials".

BACKGROUND OF THE INVENTION

The quality of a thin film formed on a substrate by a sputtering method can be influenced by the surface roughness of a target material used for the sputtering. When protrusions having a larger size than a certain level are present on the surface of the target material, an abnormal discharge (so-called micro-arcing) can be caused at the protrusions. The abnormal discharge can result in macroparticles being scattered out from the surface of the target material, and deposited onto the substrate. The deposited macroparticles can cause blobs on the thin film and result in short circuiting of semiconductor thin film circuits. The deposited macroparticles are usually called "particles" or "splats".

The surface roughness of a target material can have a correlation to a crystal grain size of the target material. The finer the crystal grain size, the smaller the surface roughness of the target material. Accordingly, by reducing the size of crystal grains existing within the target material, it is possible to prevent the generation of the "particles", thereby allowing better quality thin films to be formed than can be formed from targets having larger grain sizes.

Numerous materials can be utilized as target materials, including, for example, copper, aluminum and titanium. In particular applications, target materials can comprise alloys or other metallic mixtures, with exemplary mixtures comprising one or more of copper, aluminum or titanium. Target materials can also comprise so-called "high purity" forms of particular metallic materials, with exemplary targets being from 99.99% pure to greater than 99.9999% pure in one or more of titanium, aluminum and copper.

Several methods have been proposed for forming improved target constructions. In Japanese Patent Application Laid-Open (KOKAI) No. 11-54244 (1999), there has been proposed a target material composed of titanium and having an average crystal grain size of 0.1 to 5 $\mu$m. The target material is produced by hydrogenating titanium subjecting the titanium to plastic working while maintaining an a-phase or ($\alpha$-$\beta$)-phase crystal structure thereof, and then dehydrogenating and heat-treating the titanium. However, a production method which includes hydrogenation and dehydrogenation treatments can be problematic from the industrial viewpoint. Consequently, it would be desirable to develop an alternative process for producing a titanium target material.

Another method proposed for forming an improved target construction is set forth in Japanese Patent Application Laid-Open (KOKAI) No. 10-330928 (1998). Such proposes a sputtering target material made of an aluminum alloy and containing crystal grains having an average diameter of not more than 30 $\mu$m. The target material is produced by subjecting a raw metal material to plastic working, and then rapidly heating the metal material to a re-crystallizable temperature. The rapid heating utilizes an average temperature increase ramp rate of 100° C./minute. A difficulty with the production method of KOKAI No. 10-330928 is that it can require a special heating method to accomplish the rapid heating, with exemplary special heating methods including an infrared irradiation method, an electromagnetic induction heating method or an immersion method using either a salt bath or a bath of low-melting alloy such as solder. Thus, the production method can be difficult to incorporate cost-effectively into industrial processes. Accordingly, it would be desirable to develop alternative processes for producing aluminum target materials.

SUMMARY OF THE INVENTION

The invention encompasses methods of reducing grain sizes of materials, and in particular applications encompasses methods of reducing grain sizes of titanium-comprising materials, aluminum-comprising materials, and/or copper-comprising materials. The invention further encompasses methods of forming sputtering targets. In a particular embodiment, the invention encompasses a method for producing a sputtering target material in which a metallic material is subjected to plastic working at a processing percentage of at least 5% utilizing a processing rate of at least 100% per second (i.e., 100%/second). In particular applications the metallic material comprises one or more of aluminum, copper and titanium.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
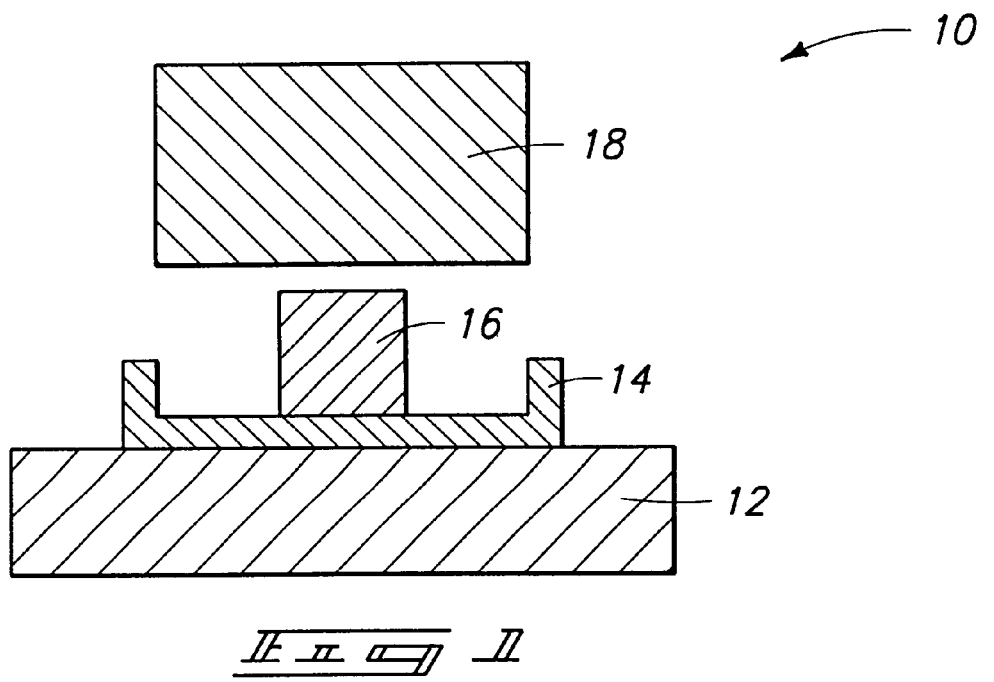
FIG. 1 is a diagrammatic, cross-sectional view of an apparatus which can be utilized in a process encompassed by the present invention, and illustrates a raw material in the apparatus at a preliminary processing step.

The present invention can overcome at least some of the problems described above in the "BACKGROUND" section of this disclosure. Specifically, the present invention can provide an industrially useful process for producing materials with reduced grain sizes, and can be utilized, for example, to form a sputtering target material that generates few "particles" during film formation. In particular aspects, the invention comprises methods of forming targets which comprise one or more of aluminum, copper and titanium.

In one aspect of the invention, it has been found that by appropriately controlling plastic working conditions used for the production of a material, specifically a processing rate thereof, it is possible to reduce the size of crystal grains of the material. The reduction of crystal grain size can improve sputtering properties of a sputtering target formed from the material relative to targets formed from materials having larger grain sizes.

Aspects of the present invention are described in detail below. In particular described aspects, titanium is used as a raw material which is subjected to appropriate processing to reduce a grain size within the material. The titanium materials can include materials formed by melting sponge-like titanium with a vacuum metallurgy method or the like, and then casting the melt into titanium ingots. In exemplary embodiments of the present invention, titanium-comprising materials are utilized which comprise high-purity titanium having a purity of 99.99 to 99.9999% by weight (4N to 6N), or greater. The invention also comprises utilization of copper as a raw material, and in exemplary embodiments copper-comprising materials are utilized which comprise high-purity copper having a purity of 99.99 to 99.9999% by weight, or greater. Another aspect of the invention utilizes aluminum, or an alloy thereof, as a raw material, and in exemplary embodiments aluminum-comprising materials are utilized which comprise high-purity aluminum having a purity of 99.99 to 99.9999% by weight, or greater. The aluminum-comprising materials can further comprise one more elements in addition to the aluminum, with said one or more elements including at least one element selected from the group consisting of Si, Cu, Ti, Cr, Mn, Zr, Hf and rare earth elements (such as Sc, Y or Nd). The total amount of additional elements added to the aluminum of a target material is usually from 0.01% to 10% (by weight), and can be from 0.03% to 3% (by weight).

A process of the present invention can include plastic working of a material until a processing percentage of at least 5% is reached. The material can comprise one or more of titanium, aluminum and copper. The plastic working can be utilized to control the crystal orientation content of the processed material. As utilized herein, "plastic working" refers to processing which deforms a raw material. An exemplary plastic working process is rolling. A deformation percentage (percentage of reduction in thickness) of the raw material upon such a processing is called "processing percentage". In the present invention, the upper limit of the processing percentage is typically about 90%. A "processing rate" is a rate at which a material is deformed, and is expressed in terms of an amount of compression per unit time. For instance, a processing rate of 100%/second means that a material is compressed at a rate such that a compressing die would travel an entirety of the material's original thickness in one second; a rate of 500%/second means that a material is compressed at a rate such that a compressing die would travel five-times the material's original thickness in one second; etc. In one aspect of the invention, a process for reducing a grain size of a metal-comprising raw material comprises subjecting the material to plastic working at a processing percentage of at least 5% while maintaining a processing rate of at least 100%/second. In other words, the processing rate utilized to obtain the processing percentage of at least 5% is at least 100%/second. It is noted that a processing rate will typically slow during a plastic working process from an initial rapid rate to a rate of zero as the compressing die compresses a material and subsequently comes to a rest on the compressed material. In preferred embodiments, the processing rate will remain equal to or greater than 100%/second during at least a 5% compression of a worked material.

An important feature of the present invention can be that it includes subjecting a material to plastic working at high processing rates (i.e., at processing rates of at least 100%/second). Processing rates of the present invention can be at least 500%/second, and in particular embodiments of the invention are at least 1,000%/second. The upper limit of the processing rate is usually about 10,000%/second. In contrast to the processing rates of the present invention, the processing rates conventionally used for the plastic working are low processing rates of less than 100%/second, such as, for example, about 20%/second. Thus, the present invention utilizes a higher processing rate than conventional methods.

An apparatus 10 which can be utilized in methodology of the present invention is described with reference to FIGS. 1–3. Referring to FIG. 1, apparatus 10 comprises a support 12 having a first die 14 thereon. A material 16 is provided on first die 14 for processing. Material 16 can comprise, for example, a high purity titanium, copper or aluminum ingot. A second die 18 is provided above material 16, and configured to mate within first die 14. First die 14 can define a shape that material 16 is too be pressed into, such as, for example, a round sputtering target shape. A power source (not shown) can be connected to second die 18 and utilized to press second die 18 into first die 16 at a desired processing rate. It is noted that the power source can be coupled to one or both of first die 14 and support 12, alternatively to, or in addition to, being coupled with first die 18. It is also noted that first die 18 can be a heavy "hammer", formed of, for example, iron, which is elevated above first die 14 and then subsequently dropped onto the first die. An exemplary hammer has a weight of about 4 tons. The rate of processing applied by such hammer can be controlled by controlling the height from which the hammer is dropped.

Figure 2:
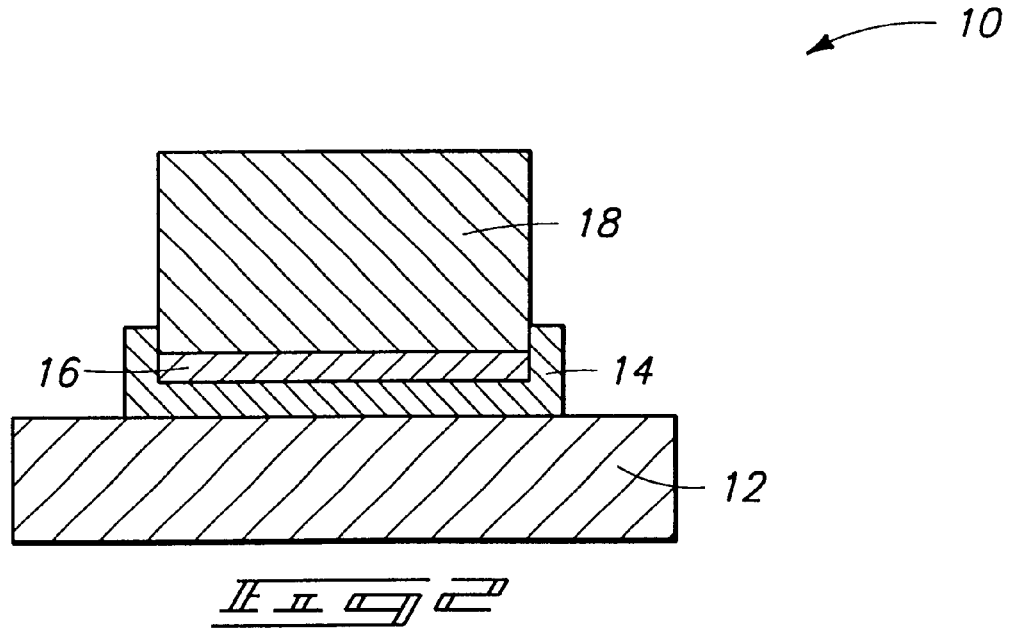
FIG. 2 is a view of the FIG. 1 apparatus and shows the material of FIG. 1 at a processing step subsequent to that of FIG. 1.

Referring to FIG. 2, apparatus 10 is shown after second die 18 has compressed material 16 into first die 14.

Figure 3:
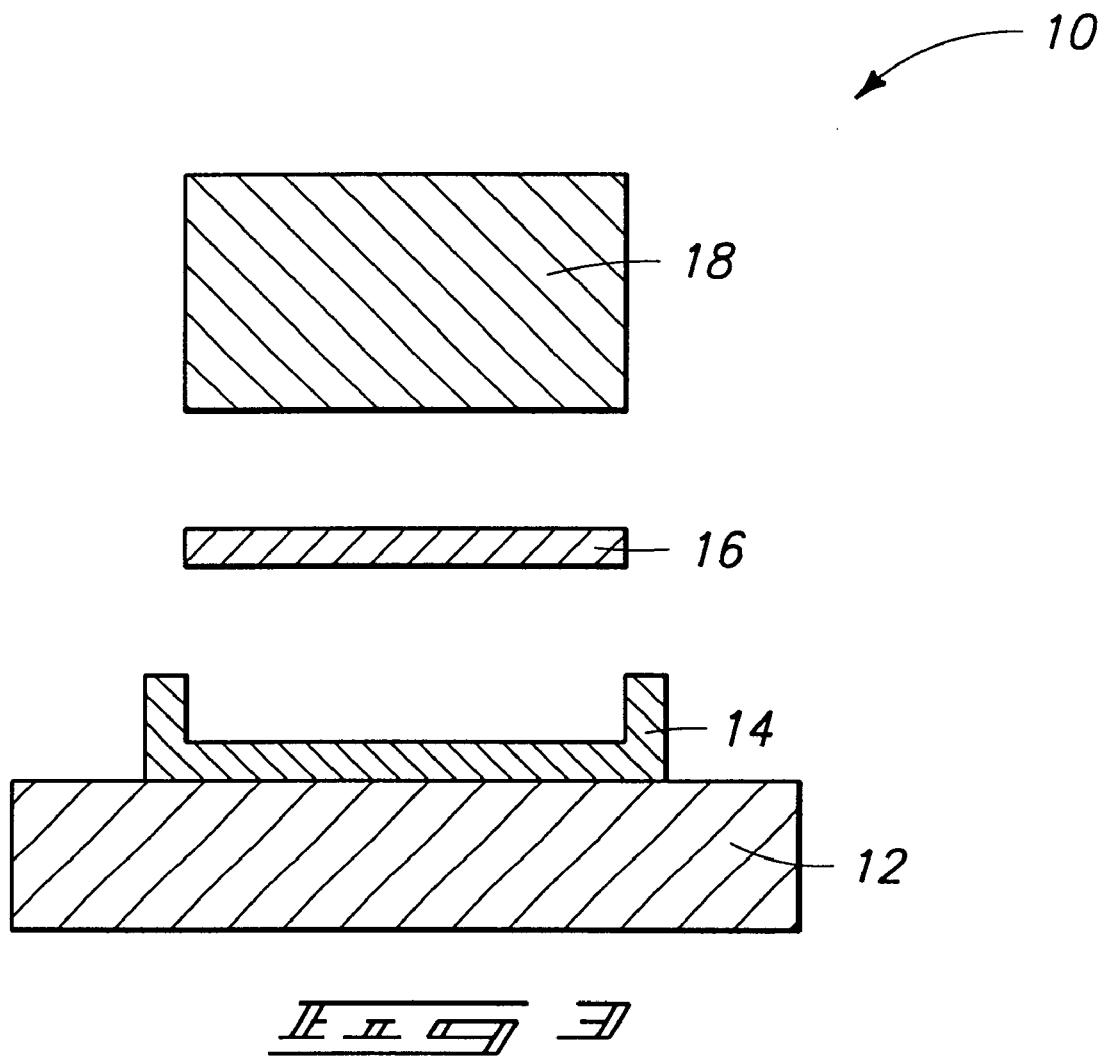
FIG. 3 is a exploded view of the FIG. 1 apparatus and material after the processing step of FIG. 2.

Referring to FIG. 3, apparatus 10 and material 16 are shown in an exploded view after the processing of FIG. 2 to illustrate material 16 separate from apparatus 10, and to show that material 16 has been compressed into a shape defined by first die 14.

The use of the high processing rates of the present invention can provide several advantages, including that the high processing rates can enable the heat-treatment ordinarily required subsequent to the plastic working to be omitted. Instead, high processing rates of methods of the present invention can allow the plastic working itself to enable crystal grains of the obtained target material to be well-controlled in size (i.e., become finer).

The present invention can be particularly useful for processing titanium. Titanium target materials produced by processes according to the present invention can have an average titanium crystal grain size of not more than 4 $\mu$m. Titanium-comprising thin films obtained by sputter deposition from such targets can have reduced amounts of "particles" generated thereon relative to films formed by sputtering from conventionally produced targets. Exemplary targets produced by methods of the present invention, and exemplary films sputtered from such targets, are described in Examples below.

The present invention can be also be particularly useful for processing aluminum and alloys of aluminum. Aluminum-comprising target materials produced by processes according to the present invention can have an average crystal grain size of not more than 20 $\mu$m. Aluminum-comprising thin films obtained by sputter deposition from such targets can have reduced amounts of "particles" generated thereon relative to films Ash formed by sputtering from conventionally produced targets. Exemplary targets produced by methods of the present invention, and exemplary films sputtered from such targets, are described in Examples below.

The above-described high-rate plastic working of the present invention is preferably repeated a plurality of times on a given processed material. More specifically, it can be preferred that the high-rate plastic working be repeated two or more times. The different plastic working steps can occur along the same axis dimensions of material as one another, or along different axis dimensions. It can be preferred that the different plastic working steps involve at least three separate steps, with a first step having pressure applied in a first axis direction of a material (e.g., an X-axis or Y-axis direction); a second step having pressure applied in a second axis direction of the material (the second axis direction can be perpendicular to the first axis direction); and a third step having pressure applied again along the first axis direction.

In a particular example, a round rod-shaped raw material is used, and two or more high-rate plastic working processes are conducted to spread the round bar-shaped raw material (e.g., forging). Also, a low-rate plastic working is utilized to elongate the round rod-shaped raw material by applying a pressure thereto in the circumferential direction (plastic working similar to swaging). The low-rate plastic working step is interposed between two of the high-rate plastic working steps. The swaging-like plastic working is typically conducted at low processing rates because it can be difficult to conduct such swaging-like plastic working at high-rate processing.

The low-rate plastic working and the high-rate plastic working are usually performed by a hydraulic press method and a hammer press method, respectively. The hammer press method enables the processing rate to be readily controlled by changing a drop height of an iron hammer. The maximum number of repeated high-rate plastic working processes is not particularly restricted, and the high-rate plastic working is usually repeated three to five times.

Subjecting a raw material to the above-described high-rate plastic working of the present invention can impart desired properties of a sputtering target to the material. The high-rate plastic working of a material is preferably conducted until a processing percentage of at least 5% is reached, while the low-rate plastic working can be conducted at an optional processing percentage.

A raw material can be heated by a spontaneous heat produced upon the plastic working during high-rate processing of the present invention. It can be preferred that a raw material comprising titanium be maintained at a temperature of not more than 400° C. during the plastic working. When the temperature of the raw material is more than 400° C., the raw material can suffer from abrupt crystal growth, which can render it difficult to obtain fine crystal grains. It can also be preferred that a raw material comprising aluminum (such as, for example, a material comprising either pure aluminum, or an aluminum alloy) be maintained at a temperature of from about 50° C. to about 450° C. during the plastic working. When the temperature of an aluminum-comprising raw material is more than 450° C., the raw material can suffer from abrupt crystal growth, which can render it difficult to obtain fine crystal grains.

A titanium-comprising target material produced by a process of the present invention can have an average crystal grain size of not more than 4 μm, and preferably not more than 2 μm. A lower limit of the average crystal grain size of a titanium-comprising target material is usually 0.1 μm. In interpreting this disclosure and the claims that follow, the term "average grain size" refers to a mean grain size. Targets produced by methodology of the present invention will preferably have relatively tight distributions of grains sizes. In particular examples, the distribution will be such that at least 99% of the grains of a target will be within a factor of 10 of the mean grain size.

An aluminum-comprising target material produced by a process of the present invention can have an average crystal grain size of not more than 20 μm, and preferably not more than 10 μm. A lower limit of the average crystal grain size of an aluminum-comprising target material is usually 0.1 μm.

EXAMPLES

The invention is illustrated by, but not limited to, the following examples.

Titanium Processing Examples Examples 1–6 and Comparative Examples 1–5 (Shown in Table 2)

A round, rod-shaped titanium ingot having a diameter of 150 mm, a length of 150 mm and a purity of 99.995% (by weight) is subjected to the plastic working steps (a) through (d) that are described below in Table 1. The plastic working steps were continuously conducted three times. Subsequent to the plastic working, a further the plastic working for spreading the raw material (forging) was conducted at a processing rate of 20%/second, thereby forming the raw material into an appropriate shape and obtaining a target material having a size of 410 mm in diameter×20 mm in length.

TABLE 1

| | Pressure-applying direction (phenomenon) | Processing Percentage (%) | Processing Rate (%/sec.) | Final Dimension (diameter mm × length) |
|---|---|---|---|---|
| (a) | Circumferential direction (elongation) | 8.7 | 20 | 137 × 180 |
| (b) | Axial direction (spread) | 44.4 | Speed described in Table 2 | 184 × 100 |
| (c) | Circumferential direction (elongation) | 25.5 | 20 | 137 × 180 |
| (d) | Axial direction (spread) | 44.4 | Speed described in Table 2 | 184 × 100 |

The low-rate plastic working for elongation was conducted by a hydraulic press method, and the high-rate plastic working for spreading was conducted by a hammer press method. During the above plastic working steps, the temperature of the raw material was maintained at about 300° C. by the spontaneous heat.

Measurement of Average Crystal Grain Size

After polishing the surface of the obtained target material by sandpaper, the target material was etched with boiling nitric acid and then subjected to electrolytic polishing to finish the surface of the target material into a mirror surface. Thereafter, the surface of the target material was etched with boiling nitric acid to expose a grain boundary thereof. The exposed grain boundary was magnified 800 times by an optical microscope and photographed. From the obtained photograph, the average crystal grain size was measured by a quadrature method. The results are shown in Table 2.

TABLE 2

| Examples and Comparative Examples | Processing Rate (%/second) | Average Crystal Grain Size (μm) | Number of "Particles" |
|---|---|---|---|
| Comparative Example 1 | 10 | 70.0 | 72 |
| Comparative Example 2 | 20 | 39.4 | 60 |
| Comparative Example 3 | 45 | 18.0 | 47 |
| Comparative Example 4 | 66 | 9.7 | 36 |
| Comparative Example 5 | 88 | 5.2 | 8 |
| Example 1 | 100 | 3.4 | 2 |
| Example 2 | 500 | 2.5 | 2 |
| Example 3 | 1,000 | 2.0 | 1 |
| Example 4 | 2,000 | 1.8 | 1 |
| Example 5 | 4,000 | 1.6 | 1 |
| Example 6 | 6,000 | 1.4 | 1 |

Determination of the Particles

The target material was cut into a disc having a diameter of 250 mm and a thickness of 12 mm. The disc was placed in a sputtering device and sputtered under the following conditions: Power=3 kW; Gas pressure=10 mTorr; Gas ratio (Ar/N2)=1/1; and Film thickness=50 nm. The sputtering formed a TiN film on a 6-inch silicon wafer. After completion of the sputtering, the number of "particles" in the thin film formed on the silicon wafer was measured using a laser-type particle counter (trade name: "SF-6420" manufactured by TENCOR Instruments Corp.). The number of "particles" having a diameter of at least 3 μm was measured with respect to 12 silicon wafers, and the average of the measured values was determined to be the number of "particles" per one silicon wafer.

Aluminum Processing Examples

Examples 7–12 and Comparative Examples 6–10 (Shown in Table 4)

A round rod-shaped aluminum-alloy ingot composed of aluminum (a purity of 99.999% by weight) with 0.5% by weight copper is used as a starting material. The ingot had a diameter of 150 mm and a length of 150 mm. The ingot was subjected to the plastic working steps (a) to (f) that are described below in Table 3. The plastic working steps were continuously conducted three times. Subsequent to the plastic working of steps (a) to (f), a further plastic working for spreading the raw material (forging) was conducted at a processing rate of 20%/second, thereby forming the raw material into an appropriate shape and obtaining a target material having a size of '410 mm in diameter×20 mm in length.

TABLE 3

| | Pressure-applying direction (phenomenon) | Processing Percentage (%) | Processing Rate (%/sec.) | Final Dimension (diameter mm × length) |
|---|---|---|---|---|
| a) | Circumferential direction (elongation) | 8.7 | 20 | 137 × 180 |

TABLE 3-continued

| | Pressure-applying direction (phenomenon) | Processing Percentage (%) | Processing Rate (%/sec.) | Final Dimension (diameter mm × length) |
|---|---|---|---|---|
| b) | Axial direction (spread) | 44.4 | Speed described in Table 2 | 184 × 100 |
| c) | Circumferential direction (elongation) | 25.5 | 20 | 137 × 180 |
| d) | Axial direction (spread) | 44.4 | Speed described in Table 2 | 184 × 100 |
| e) | Circumferential direction (elongation) | 25.5 | 20 | 137 × 180 |
| f) | Axial direction (spread) | 44.4 | Speed described in Table 2 | 184 × 100 |

The low-rate plastic working for elongation was conducted using a hydraulic press, and the high-rate plastic working for spreading was conducted using a hammer press. During the plastic working steps, the temperature of the raw material was maintained in the range of from 50° C. to 450° C. For instance, the processing of Example 9 of Table 4 (processing speed of 1,000%/second), was conducted as follows: The temperatures immediately before and immediately after the working step (b) were maintained at 30° C. and 100° C., respectively; the temperatures immediately before the working step (d) (controlled by cooling) and that immediately after the working step (d) were maintained at 80° C. and 150° C., respectively; and the temperatures immediately before the working step (f) (controlled by cooling) and that immediately after the working step (f) were maintained at 80° C. and 150° C., respectively.

Measurement of Average Crystal Grain Size

After polishing the surface of the obtained target material by a sandpaper, the target material was etched with an etching solution composed of HCl:HNO3:HF:H2O= 3:1:1:20 (weight ratio) to expose a grain boundary thereof. The exposed grain boundary was magnified 800 times by an optical microscope and photographed. From the obtained photograph, the average crystal grain size was measured by a quadrature method. The results are shown in Table 4.

Determination of the Particles

The target material was cut into a disc having a diameter of 250 mm and a thickness of 12 mm. The disc was placed in a sputtering device and sputtered under the following conditions: Power=5 kW; Gas pressure=3 mTorr; Sputtering gas=Ar (100%); and Film thickness=50 nm. The sputtering formed an Al-Cu alloy film (0.5%, by weight, Cu) on a 6-inch silicon wafer. After completion of the sputtering, the number of "particles" in the thin film formed on the silicon wafer was measured using a laser-type particle counter (SF-6420™ manufactured by TENCOR Instruments Corp.). The number of "particles" having a diameter of at least 0.2 μm was measured with respect to 12 silicon wafers, and the average of the measured values was determined to be the number of "particles" per one silicon wafer.

TABLE 4

| Examples and Comparative Examples | Processing Rate (%/sec.) | Average Crystal Grain Size (μm) | Number of "Particles" |
|---|---|---|---|
| Comparative Example 6 | 10 | 200 | 82.3 |
| Comparative Example 7 | 13 | 150 | 65.5 |
| Comparative Example 8 | 20 | 100 | 47.5 |
| Comparative Example 9 | 27 | 57 | 33.4 |
| Comparative Example 10 | 52 | 30 | 20.9 |
| Example 7 | 100 | 20 | 5.6 |
| Example 8 | 500 | 10 | 3.9 |
| Example 9 | 1,000 | 8 | 3.2 |
| Example 10 | 2,000 | 6 | 2.7 |
| Example 11 | 4,000 | 4 | 1.5 |
| Example 12 | 6,000 | 2 | 1.3 |

The invention described herein can provide an industrially useful process for producing target materials which are reduced in the number of "particles" generated during a film-forming process relative to conventionally-produced target materials. In particular embodiments of the invention, the target materials can comprise one or more of aluminum, titanium and copper. The invention can enable high throughput of materials by reducing processing steps. Specifically, a grain size of a target material can be reduced simultaneously with the shaping of the material into a target shape by utilizing a die that is appropriately configured to form a target shape during high-rate plastic working. The invention can also reduce material waste since a processed material can be formed into the shape of a target, and accordingly cutting and other material removing steps can be avoided in forming targets.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A material comprising aluminum grains, with an average crystal grain size of the aluminum grains being not more than 20 μm; and the material comprising Mn in addition to aluminum, with a total non-aluminum content of the material being from about 0.01% to about 10% by weight.

2. The material of claim 1 being in the shape of a sputtering target.

3. The material of claim 1 wherein the average crystal grain size of the aluminum grains is not more than 10 μm.

4. The material of claim 1 wherein the average crystal grain size of the aluminum grains is not more than 4 μm.

5. The material of claim 1 wherein the average crystal grain size of the aluminum grains is not more than 2 μm.

6. The material of claim 1 further comprising Cr.

7. The material of claim 1 wherein the total non-aluminum content is from about 0.03% to 3% by weight.

* * * * *

UNITED STATES PATENT AND TRADEMARK OFFICE
CERTIFICATE OF CORRECTION

PATENT NO. : 6,423,161 B1 Page 1 of 1
DATED : July 23, 2002
INVENTOR(S) : Dr. Lijun Yao et al.

It is certified that error appears in the above-identified patent and that said Letters Patent is hereby corrected as shown below:

Column 1,
Line 64, replace "a-phase or ($\alpha$-$\beta$)-phase crystal structure thereof, and then" with -- $\alpha$-phase or ($\alpha$-$\beta$)-phase crystal structure thereof, and then --

Column 5,
Line 1, replace ""particles" generated thereon relative to films Ash formed by" with -- "particles" generated thereon relative to films formed by --

Column 10,
Line 27, replace "The material of claim 1wherein the average crystal" with -- The material of claim 1 wherein the average crystal --

Signed and Sealed this

Twenty-fourth Day of June, 2003

JAMES E. ROGAN
*Director of the United States Patent and Trademark Office*